United States Patent
Lebedev et al.

(10) Patent No.: US 8,294,135 B2
(45) Date of Patent: Oct. 23, 2012

(54) HIGH POWER DENSITY PHOTO-ELECTRONIC AND PHOTO-VOLTAIC MATERIALS AND METHODS OF MAKING

(75) Inventors: Nikolai Lebedev, Springfield, VA (US); Scott A Trammell, Springfield, VA (US); Stanislav Tsoi, Alexandria, VA (US); Mark E Twigg, Falls Church, VA (US); Joel M Schnur, Burke, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 138 days.

(21) Appl. No.: 12/776,796

(22) Filed: May 10, 2010

(65) Prior Publication Data
US 2011/0073836 A1 Mar. 31, 2011

Related U.S. Application Data

(60) Provisional application No. 61/178,127, filed on May 14, 2009.

(51) Int. Cl.
 *H01L 29/72* (2006.01)
(52) U.S. Cl. ............... 257/9; 977/752; 977/842
(58) Field of Classification Search .......... 257/9
 See application file for complete search history.

(56) References Cited

U.S. PATENT DOCUMENTS

| | | | |
|---|---|---|---|
| 2007/0047056 A1* | 3/2007 | Kempa et al. | 359/245 |
| 2007/0119496 A1* | 5/2007 | Baldo et al. | 136/252 |
| 2007/0157967 A1* | 7/2007 | Mershin et al. | 136/263 |
| 2007/0212730 A1* | 9/2007 | Vepari et al. | 435/7.1 |
| 2008/0001144 A1* | 1/2008 | Rand et al. | 257/40 |

OTHER PUBLICATIONS

Lebedev et al. Increasing Efficiency of Photoelectronic Conversion by Encapsulation of Photosynthetic Reaction Center Proteins in Arrayed Carbon nanotube Electrode. Langmuir, 2008,24 (16), pp. 8871-8876 DOI: 10.1021/Ia8011348 , Jul. 11, 2008.*

* cited by examiner

*Primary Examiner* — Edward Wojciechowicz
(74) *Attorney, Agent, or Firm* — Amy L. Ressing; Stephen T. Hunnius

(57) ABSTRACT

A high power density photo-electronic and photo-voltaic material comprising a bio-inorganic nanophotoelectronic material with a photosynthetic reaction center protein encapsulated inside a multi-wall carbon nanotube or nanotube array. The array can be on an electrode. The photosynthetic reaction center protein can be immobilized on the electrode surface and the protein molecules can have the same orientation. A method of making a high power density photo-electronic and photo-voltaic material comprising the steps of immobilizing a bio-inorganic nanophotoelectronic material with a photosynthetic reaction center protein inside a carbon nanotube, wherein the immobilizing is by passive diffusion, wherein the immobilizing can include using an organic linker.

14 Claims, 5 Drawing Sheets

HIGH POWER DENSITY PHOTO-ELECTRONIC AND PHOTO-VOLTAIC MATERIALS AND METHODS OF MAKING

CROSS-REFERENCE TO RELATED APPLICATIONS

This application is a non-provisional application of and claims priority to U.S. patent application No. 61/178,127 filed May 14, 2009, the entirety of which is herein incorporated by reference.

BACKGROUND OF THE INVENTION (1) Field of the Invention

This disclosure describes an innovative high-density nano-organized multifunctional material for photo-electronics and photovoltaic devices.

(2) Description of Related Art Including Information Disclosed Under 37 C.F.R. 1.97 and 1.98

The construction of highly efficient bio-photo-voltaic and bio-electronic devices will lead to major breakthroughs in a variety of areas. Construction and utilization of conducting molecules with precise spatial organization based on protein scaffolds and controlled current-voltage characteristics through biosynthetic chemical modification will lead to highly efficient and reproducible components for light energy conversion, solar-based photo-voltaic cells, miniaturized electronic and logic devices needed for communication and situational awareness.

This development will also lead to new miniaturized sensors for chemical and biological warfare. Development of self-assembling bio-electronic surfaces with large field- and photo-induced mobilities will lead to a new array of applications like active matrix backplanes for field-portable displays, electronic skin, smart skin for land warriors, for powering electronic systems on ships and electronic fabrics for divers.

The construction of efficient light energy conversion (photovoltaic, PV) devices is a great challenge of current science and technology. Most of the current photovoltaic devices are based on crystallized silicon. They have energy conversion efficiencies of about 12% (19-25% in the laboratory) and cost $(1-3.5)/W.

An alternative approach is organic photovoltaic devices. These devices have small size and weight, but are less efficient than Si (~5%) and require expensive purification. Their assembly in multifunctional structures is a challenge.

BRIEF SUMMARY OF THE INVENTION

This disclosure describes an innovative high-density nano-organized multifunctional material for photo-electronics and photovoltaic devices.

The material is assembled by encapsulation of photosynthetic reaction center proteins in well-organized arrays of aligned carbon nanotubes (CNT).

The material has oriented and aligned protein monolayer at inner tube surface allowing for highly efficient light harvesting and unidirectional photo-induced charge separation and electron transfer in the monolayer.

Vertical orientation and alignment of carbon nanotubes allows for highly conductive vectorial electron transfer in the supporting electrode.

Tubular organization and precise protein packing inside the tubes allows for efficient light harvesting.

Utilization of CNT both for light harvesting and electron transfer increases the functional density and reduces the weight of the material.

Our innovative approach to the construction of photovoltaic devices is in the utilization of biological systems and principles. Biological electronic devices, proteins, have extremely high efficiency, precise spatial organization, and are inexpensive in fabrication. They can be fused with inorganic and organic materials such as conductors, semiconductors, conductive polymers, or quantum dots.

The photosynthetic reaction center protein (RC) is one of the most advanced photo-electronic devices. It has a maximum possible quantum yield of primary charge separation (nearly 100%), an extremely fast operation time (about $10^{-9}$ s, or operation frequency of ~$10^9$ Hz), and a very efficient stabilization of separated charges (the ratio electron transfer forward and back is about $10^3$).

The charge separation and stabilization occur in complexes of 7 nm size and lead to the formation of a local electric field of about $10^6$ V/cm. These features, leading potentially up to 36% power conversion efficiency, make RC very attractive for the construction of innovative photovoltaic and electronic devices.

Another aspect of modern technology is waste-less and environmental friendly assembly of functional devices. Again, we have a nice paradigm for how to do that by demonstration of protein folding and bottom up self-assembly leading to the formation of 100% reproducible 3D scaffold for small organic molecules. Utilization of these, natural for proteins features will greatly benefit the technological process.

In addition, substantial improvement of the performance of electronic devices is occurring now due to the development of nano-organized materials like molecular wires and carbon nano tubes (CNT). These materials are extremely electrically conductive, have large active surface areas, are mechanically stable and at the same time are extremely light in weight.

A first step for utilizing the RC protein in artificial bio-inorganic devices is the immobilization of the protein on an electrode surface while retaining its natural function. Moreover, to be most effective most or all protein molecules must have the same desired orientation. This can be achieved by using genetically engineered bacterial photosynthetic reaction centers and specifically synthesized organic linkers.

Using these approaches we were able to construct monomolecular layers of aligned bacterial photosynthetic RC proteins on surfaces gold, glass, ITO, and carbon electrodes. Our experiments have shown that after binding to an electrode, photosynthetic RC can undergo efficient photoinduced charge separation, operate as photo rectifiers and transfer current in only one direction consistent with the orientation of the protein.

Carbon nanotubes (CNT) are one of the most advanced inorganic nanomaterials. They have unique electron transfer (ET), thermal transfer, and mechanical properties. The possibility of CNT utilization for electronic, sensing and signaling devices has already been demonstrated. CNT electrodes have an extended surface that promises to provide a peat advantage for chemical to electronic signal transduction.

Among CNT electrodes the most advanced form is the aligned CNT array. Precise size and spatial organization of each tube allows for specific individually addressable manipulation. The possibility of CNT functionalization by proteins, nanoparticles and even single molecules bound to their surface has been demonstrated.

However, up to now the functionalization was performed mainly by binding these compounds to outer surfaces of CNT.

The encapsulation of organic molecules, metal nanoparticles, and other small carbon nanostructures, like fullerenes, inside CNT was demonstrated only very recently. These new types of so-called "X@CNT" materials, show unique properties, some of which completely differ from those observed with the same components attached to the outer CNT walls.

The present work is the demonstration that encapsulation of photosynthetic proteins inside CNT leads to the construction of highly efficient, light-weight, high power density, self-assembling photo-electronic and photovoltaic devices.

DETAILED DESCRIPTION OF THE INVENTION

This disclosure describes an innovative high-density nano-organized multifunctional material for photo-electronics and photovoltaic devices.

The material is assembled by encapsulation of photosynthetic reaction center proteins in well-organized arrays of aligned carbon nanotubes (CNT).

The material has oriented and aligned protein monolayer at inner tube surface allowing for highly efficient light harvesting and unidirectional photo-induced charge separation and electron transfer in the monolayer.

Vertical orientation and alignment of carbon nanotubes allows for highly conductive vectorial electron transfer in the supporting electrode.

Tubular organization and precise protein packing inside the tubes allows for efficient light harvesting.

Utilization of CNT both for light harvesting and electron transfer increases the functional density and reduces the weight of the material.

Figure 1:
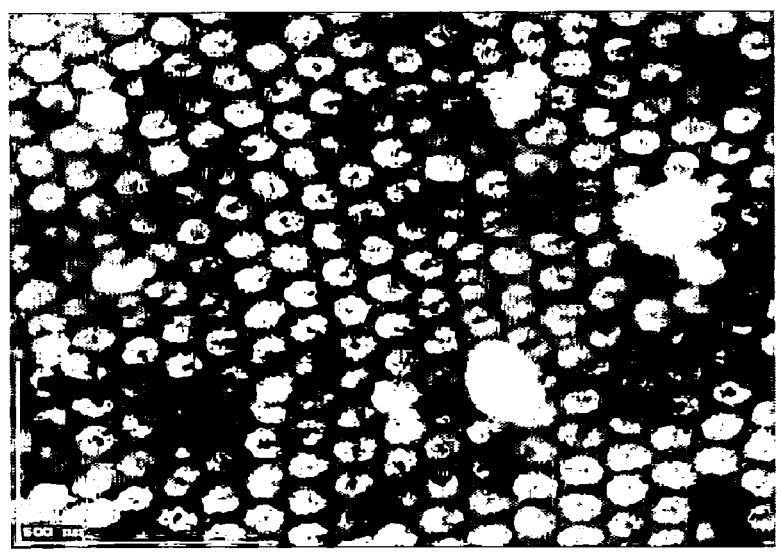
FIG. 1 shows large-scale, $2\times2$ $\mu m^2$ (A) and small-scale, $480\times480$ $nm^2$ (B) AFM topographic images of the top of a CNT array.
Figure 1:
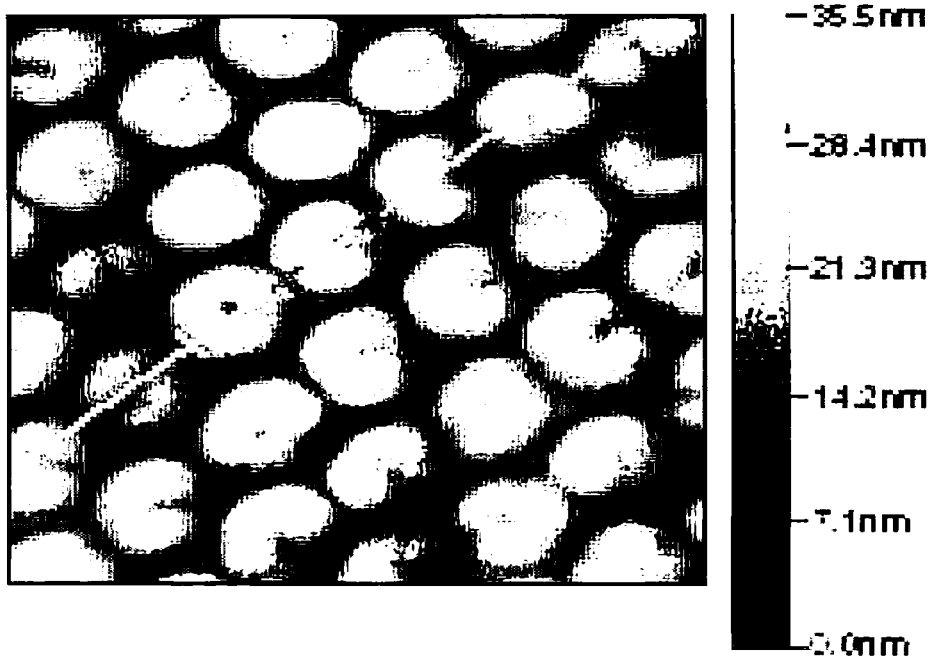

In one embodiment, for protein encapsulation a precisely aligned uniform multiwalled CNT arrays was used. Individual tubes in these arrays are separated from each other by an aluminum oxide (Al$_2$O$_3$) spacer, excluding electrical contact between them and eliminating the possibility of protein binding to the outer CNT surface. The arrays form a regular lattice with tube diameters of about 70 nm and center-to-center distances of about 150 nm (FIG. 1). The length of the tubes (the thickness of the lattice) was about 600 nm. The tubes were open to the surrounding medium from both ends allowing the liquid and protein flow through them. In addition, the tubes inside the aluminum oxide holes were grown below the spacer surface, excluding the possibility of any protein binding to CNT outer surface.

A procedure for oriented and aligned binding of the protein to CNT inner walls can include the following. The protein can be genetically engineered RC protein from *Rb. sphaeroides* having a polyhistidine (polyHis) tag at C-terminal end of its M subunit. The polyHis-tagged protein can be expressed in an RC$^-$ *Rb. sphaeroides* background, allowing for the production of only modified protein.

The protein can be purified by a combination of Ni$^2$-NTA metal affinity and Mono-Q ion exchange chromatography. The purified protein can be subjected to our standard electrophoretic, spectroscopic and photochemical analysis demonstrating its high purity and photochemical activity. The protein can be allowed to penetrate inside CNT by passive diffusion in the course of incubation of the protein stock with CNT at 4° C. for 1-2 hours.

Figure 2:
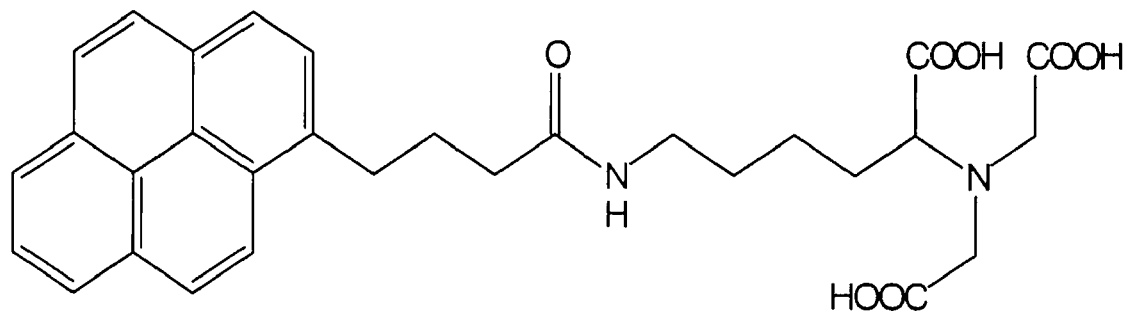
FIG. 2 shows the molecular structure of Pyrene-NTA linker used for protein oriented binding.

The amount of protein bound to the surface in our example was estimated from the intensity of its pigment fluorescence after their extraction with inorganic solvents. The protein was bound to CNT walls with a molecular linker one end of which has a pyrene group for non-covalent binding to the carbon surface through $\pi$-$\pi$ interaction. The opposite end of the linker has a NTA group for specific binding to the polyHis tag on the M-subunit (FIG. 2).

This linker allows us to achieve specific protein orientation with primary donor (special pair) side facing the tube walls. Initially a SAM monolayer was constructed inside the CNT and then, after incubation with Ni$^{2+}$, the protein was subsequently attached. To avoid the possible alteration of the CNT conductivity and Fermi level, the amount of protein inside the CNT in this particular preparation was kept relatively low.

For control experiments designed to measure binding and photochemical activity of the protein on a carbon surface, we constructed an RC-monolayer on a flat surface of highly ordered pyrolytic graphite (HOPG) using the same strategy.

Figure 3:
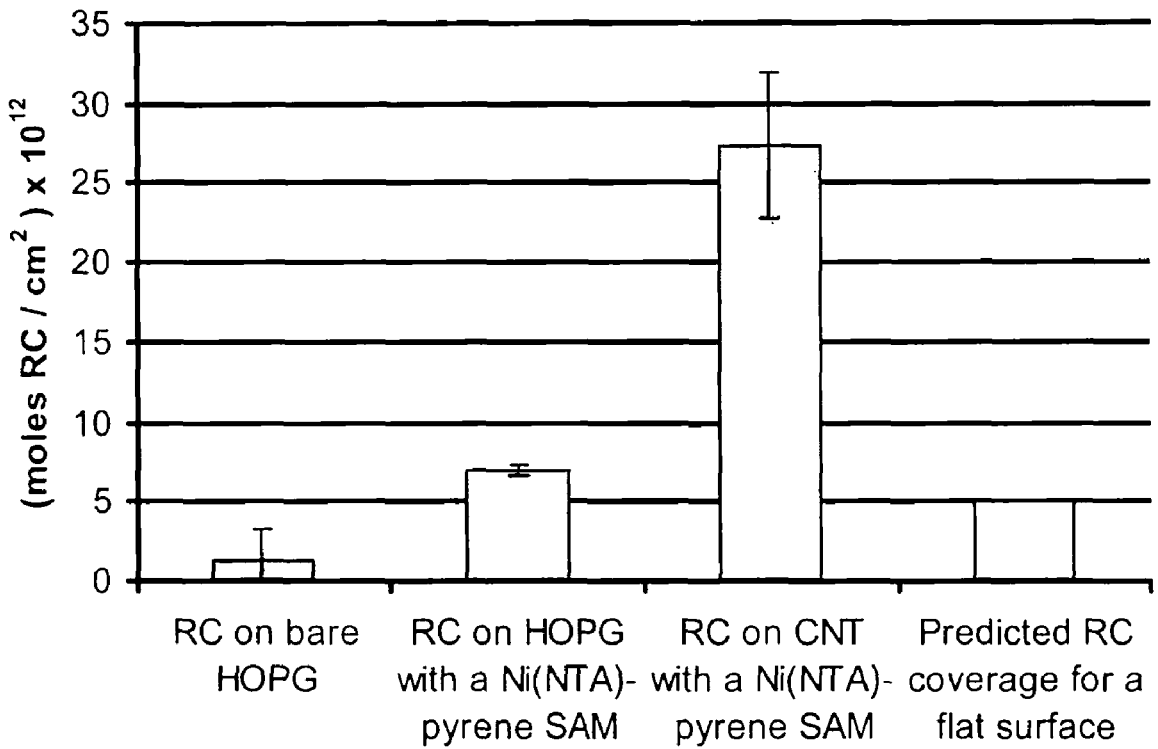
FIG. 3 shows the amounts of RC proteins (in moles/cm$^2$) bound to various substrates (indicated) after incubation with protein solution for 1 hour.

Fluorescence spectroscopic examination of the amounts of photosynthetic pigments extracted from the protein bound to the HOPG electrode demonstrates high efficiency of protein binding with a surface coverage similar to theoretical maximum (FIG. 3). Nearly no binding was observed without this linker confirming the role of the linker in protein binding.

In the case of CNT the amount of bound protein exceeded the amount that could be bound to the top surface of the electrode by about 4- to 5-fold (FIG. 3). If one assumes the average molecular size of RC to be between 6 and 7 nm, then full protein coverage for a flat surface would be between 4 to $6\times10^{-12}$ moles/cm$^2$.

RC coverage measured by porphyrin fluorescence for HOPG surfaces containing the Ni(NTA)-pyrene SAM is in close agreement with this number ($7\times10^{-12}$ moles/cm$^2$). The amount of RC protein on HOPG surfaces without the Ni(NTA) SAM is much lower ($<1\times10^{-12}$ moles/cm$^2$) clearly highlighting the importance of the Ni(NTA)-pyrene SAM for protein attachment.

The amount of RC protein hound to CNT array electrodes is 4-5 times greater ($27\times10^{-12}$ moles/cm$^2$) than for the theoretical coverage for a planar electrode implying that the protein can penetrate inside CNT and be bound onto the interior walls of the nanotube. Although the two electrode surfaces differ in curvature, the difference is at a scale much larger than that of the protein size. Given that both electrode surfaces are made of the same material and are hydrophobic, the mechanism of the RC immobilization is most likely the same.

To identify the location of the protein in CNT arrays we performed electron microscopic examination of CNT functionalized with RC by using the protein labeled with gold nanoparticles. The RC protein from *Rb. sphaeroides* has a single surface exposed cysteine at the top of its H-subunit.

This single surface exposed Cys forms a tight complex with gold nanoparticles allowing for visualization of the gold and thus protein location.

The formation of 1:1 complexes between RC and gold nanoparticles was confirmed by the complex electrophoretic mobility in agarose gel and by the shift of gold plasma absorption band upon protein binding.

Figure 4:
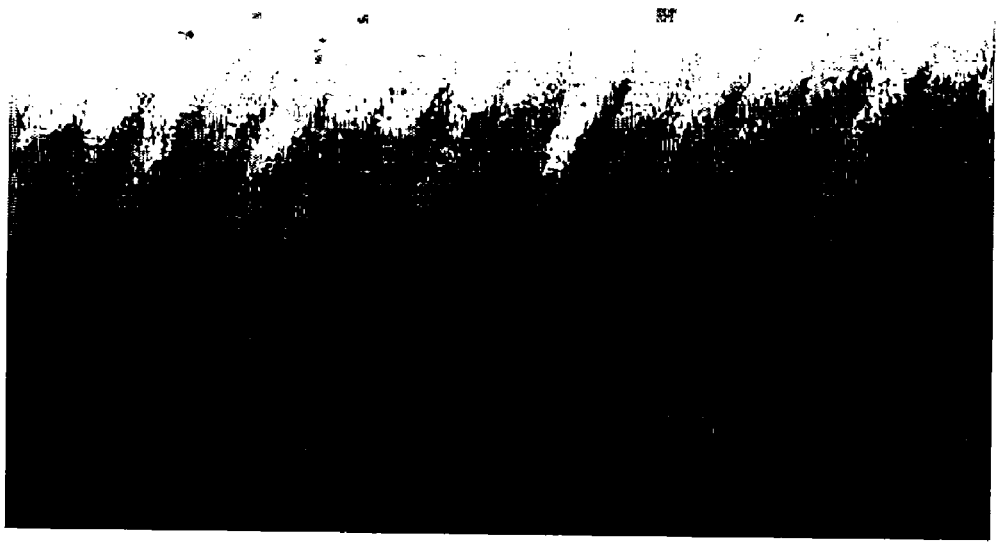
FIG. 4 shows (A) A transmission electron micrograph of a cross section of blank arrayed CNT-alumina membrane without RC protein and (B) with RC protein-nanogold conjugates.
Figure 4:

The pigment fluorescence test shows that incubation of RC-NG conjugate with CNT leads to the same elevated level of protein binding. Then the location of RC-NG conjugate inside CNT was examined by TEM. The images indeed demonstrate the location of the constructed RC-NG conjugates inside CNT (dark spots of 5 nm diameter) as shown in FIG. 4B.

The photo-electronic response of the constructed RC-CNT material was tested by electrochemical means. For these experiments, an RC-Cyt complex was formed by incubation of RC-CNT material with cytochrome c. Then the tubes were filled with 10 mM Tris buffer pH 8, 0.1% LDAO containing ubiquinone-10.

Figure 5:
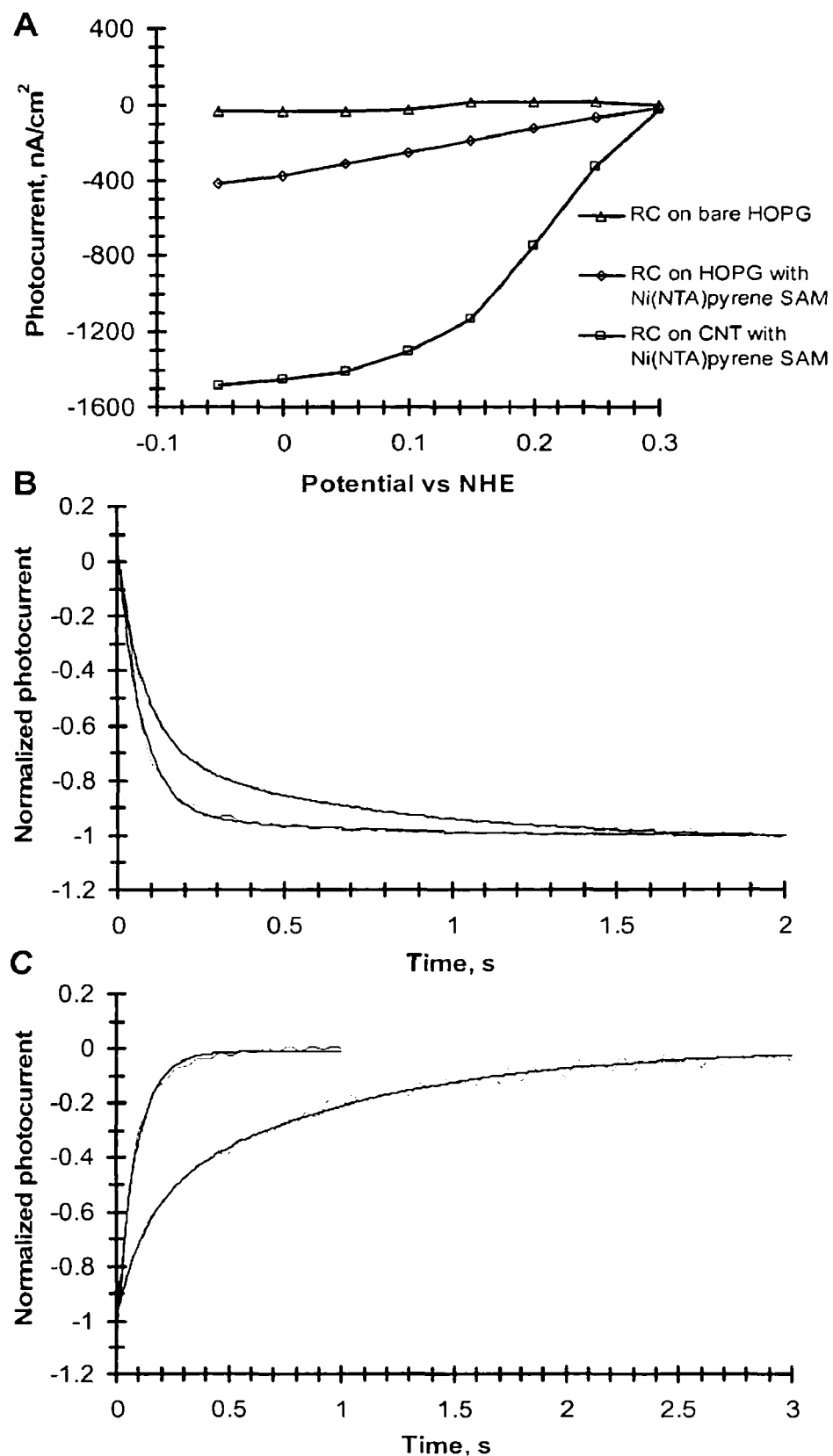
FIG. 5 shows (A) Steady-state photocurrent for RC immobilized in CNT and on HOPG electrodes at different applied potentials. Kinetics of photocurrent at onset (B) and cessation (C) of illumination, red—RC-HOPG, blue—RC-CNT. Light was >700 nm (5 mW/cm$^2$). The solution was 0.1 M Tris-HCl buffer, pH 8, with 40 □M Q2 and 2 □M cytochrome c. The electrode potential was set at 0.05 V vs NHE.

This approach allows for the formation of electrical circuit between the CNT electrode and the counter electrode. Continuous illumination of the constructed (RC-Cyt)-CNT electrode leads to the generation of stable photocurrent whose intensity increases with light. (FIG. 5).

The action spectrum of the photocurrent coincides well with the absorption spectrum of RC protein confirming that the photocurrent is due to photo-activation of the RC. The photocurrent direction shows electron flow starting at the CNT and going to the protein (FIG. 5) confirming the predicted protein orientation with the RC BChl special pair facing the electrode.

The dependence of the steady-state photocurrent on bias voltages applied to carbon nanotubes reveals that the photocurrent is generated only at electrode potentials more negative than +0.3 V vs the normal hydrogen electrode (NHE). This suggests that cytochrome c, having a formal potential ~0.26 vs NHE, is mediating electron transfer between RC and the electrode. The intensity of steady state photocurrent increases significantly with increasing negative potentials and begins to saturate at 0 V vs the NHE, demonstrating the shape typical for photovoltaic responses.

The kinetics of the photocurrent on switching the light on and off also shows substantial differences between RC-modified CNT and RC-HOPG electrodes (FIG. 5B, C), indicating faster stabilization of the photocurrent in the case of the CNT.

Since in both electrodes, the RC protein is attached to carbon surface in the same way, the faster electron transfer kinetics measured with the nanotube electrode indicates a lower internal device resistance due to higher unidirectional conductance of CNT along the tube than would be expected from the conductance along planar graphite.

The external power conversion efficiency for the constructed electrode with inner CNT surface covered by protein for about 5% is 2.5% for 863 nm light. Scaling up the coverage to total inner surface will increase the device efficiency by at least one order of magnitude.

As detailed herein this application involves a new bio-inorganic nanophotoelectronic multifunctional material with photosynthetic reaction center proteins encapsulated inside a multi-wall carbon nanotube arrayed electrode. It is suggested that no photoactive proteins have been encapsulated inside CNT up to now.

The material consists of photosynthetic RC-cytochrome complexes acting as charge separating units bound to the inner walls of a CNT electrode and with ubiquinone-10 serving as a soluble electron-transfer mediator to the counter electrode.

As detailed herein the proteins can be immobilized inside carbon nanotubes by a Ni(NTA)-alkane-pyrene linker, forming a self-assembled monolayer on the inner CNT surface. The material demonstrates an enhanced photo-induced electron transfer rate and shows substantial improvement in photocurrent density compared to that obtained with the same proteins when immobilized on a planar graphite (HOPG) electrode.

The results suggest that protein encapsulation in precisely organized arrayed tubular electrode architecture can considerably improve the performance of protein based photovoltaic and photo-electronic devices and fuel cells.

The CNT arrayed electrode can be filled with any photoactive material suitable for photo-induced charge separation, including quantum dot, organic dyes, etc. The same strategy for protein oriented binding to nanotubes inner surface can be applied to any protein having polyhistidine tag.

The CNT arrays can be used for high density protein packing by their incorporation inside CNT, utilization of photosynthetic reaction center proteins for charge separation, protein chemical modification for unidirectional oriented binding suitable for vectorial electron transfer, and utilization of carbon electrode both for electron transfer and light-harvesting.

The above description is that of a preferred embodiment of the invention. Various modifications and variations are possible in light of the above teachings. It is therefore to be understood that, within the scope of the appended claims, the invention may be practiced otherwise than as specifically described. Any reference to claim elements in the singular, e.g., using the articles "a," "an," "the," or "said" is not construed as limiting the element to the singular.

What we claim is:

1. A high power density photo-electronic and photo-voltaic material comprising a bio-inorganic nanophotoelectronic material with a photosynthetic reaction center protein encapsulated inside a multi-wall carbon nanotube; wherein the photosynthetic reaction center protein can be immobilized inside the multi-wall carbon nanotube by an organic linker to form a self-assembled monolayer on an inner carbon nanotube surface; wherein the protein encapsulation is in organized arrayed tubular electrode architecture; wherein the protein molecules have the same orientation and wherein the protein has a polyhistidine tag; and wherein protein oriented immobilization to inner carbon nanotube surface can be applied to a protein having a polyhistidine tag allowing for unidirectional protein orientation using a Ni(NTA)-alkane-pyrene linker.

2. The high power density photo-electronic and photo-voltaic material of claim 1 further including multiple multi-wall carbon nanotubes to form an array and wherein the array is on an electrode.

3. The high power density photo-electronic and photo-voltaic material of claim 1 wherein the photosynthetic reaction center protein has an average molecular size of from about 5 nm to about 7 nm and wherein the poly-histidine tagged reaction center protein is expressed from *Rhodobacter sphaeroides* strain SMpHis and has greater than 35% power conversion efficiency when utilized in a light responsive configuration comprising 2 electrodes and wherein the protein is on one electrode.

4. The high power density photo-electronic and photo-voltaic material of claim 3 wherein the local electric field is about $10^6$ V/cm.

5. The high power density photo-electronic and photovoltaic material of claim 2 wherein the electrode is comprised of one selected from the group consisting of gold, ITO, carbon, graphene, and carbon nanotubes.

6. The high power density photo-electronic and photovoltaic material of claim 2 wherein the photosynthetic reaction center protein is immobilized on the electrode surface and the protein molecules have the same orientation.

7. The high power density photo-electronic and photovoltaic material of claim 2 wherein the individual carbon nanotubes in the array are separated from each other by an aluminum oxide spacer.

8. The high power density photo-electronic and photovoltaic material of claim 7 wherein the aluminum oxide spacer excludes electrical contact between the individual tubes and prevents the photosynthetic reaction center protein from binding to the outer surface of the carbon nanotube.

9. The high power density photo-electronic and photovoltaic material of claim 8 wherein the tube diameter is from about 50 nm to about 200 nm.

10. The high power density photo-electronic and photovoltaic material of claim 9 wherein the center-to-center distance is from about 75 nm to about 500 nm.

11. The high power density photo-electronic and photovoltaic material of claim 10 wherein the length of the tubes is about from about 50 to about 2,000 nm.

12. The high power density photo-electronic and photovoltaic material of claim 8 wherein the external power conversion efficiency for the electrode with the inner carbon nanotube surface covered by protein for about 5% is about 2.5% for 863 nm light.

13. The high power density photo-electronic and photovoltaic material of claim wherein the protein has a polyhistidine tag.

14. A high power density photo-electronic and photovoltaic material comprising a bio-inorganic nanophotoelectronic material with a photosynthetic reaction center protein encapsulated inside a multi-wall carbon nanotube array wherein the photosynthetic reaction center protein is immobilized inside the multi-wall carbon nanotube by an organic linker to form a self-assembled monolayer on an inner carbon nanotube surface wherein the protein encapsulation is in organized arrayed tubular electrode architecture; wherein the photosynthetic reaction center protein has an average molecular size of from about 5 nm to about 7 nm and has greater than 35% power conversion efficiency when utilized in a device with a two electrode configuration wherein the protein is on one electrode; wherein the protein molecules have the same orientation and wherein the protein has a polyhistidine tag; and wherein protein oriented binding to carbon nanotube inner surface can be applied to a protein having polyhistidine tag allowing for unidirectional protein orientation using a Ni(NTA)-alkane-pyrene linker.

* * * * *